(12) United States Patent
Choi et al.

(10) Patent No.: US 7,807,072 B2
(45) Date of Patent: Oct. 5, 2010

(54) INKJET PRINTABLE ELECTRODE COMPOSITION, ELECTRODE INCLUDING THE SAME, AND SECONDARY BATTERY INCLUDING THE ELECTRODE

(75) Inventors: Jae-man Choi, Hwasoeng-si (KR); Moon-seok Kwon, Hwaseong-so (KR); Seung-sik Hwang, Seongnam-si (KR); Han-su Kim, Seoul (KR); Jin-hwan Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 81 days.

(21) Appl. No.: 12/118,949

(22) Filed: May 12, 2008

(65) Prior Publication Data

US 2009/0152509 A1 Jun. 18, 2009

(30) Foreign Application Priority Data

Dec. 18, 2007 (KR) .................. 10-2007-0133606

(51) Int. Cl.
*H01B 1/04* (2006.01)
*H01B 1/24* (2006.01)
*H01B 1/20* (2006.01)
*H01M 4/62* (2006.01)

(52) U.S. Cl. ............... 252/511; 252/510; 252/521.5; 252/500; 429/232; 429/231.7; 429/231.8

(58) Field of Classification Search ............ 252/511, 252/510, 521.5, 500; 429/232, 231.7, 231.8
See application file for complete search history.

(56) References Cited

U.S. PATENT DOCUMENTS

| 7,531,272 | B2 * | 5/2009 | Park et al. ............ 429/217 |
|---|---|---|---|
| 2005/0074669 | A1 * | 4/2005 | Park et al. ............ 429/217 |
| 2005/0158624 | A1 * | 7/2005 | Park et al. ............ 429/217 |
| 2005/0266314 | A1 * | 12/2005 | Sheem et al. ............ 429/231.8 |
| 2006/0134516 | A1 * | 6/2006 | Im et al. ............ 429/218.1 |
| 2006/0216606 | A1 * | 9/2006 | Kim et al. ............ 429/232 |
| 2007/0087268 | A1 * | 4/2007 | Kim et al. ............ 429/232 |
| 2008/0166633 | A1 * | 7/2008 | Hwang et al. ............ 429/217 |
| 2009/0181309 | A1 * | 7/2009 | Kwon et al. ............ 429/232 |
| 2009/0197176 | A1 * | 8/2009 | Kim et al. ............ 429/231.5 |

OTHER PUBLICATIONS

Viscosity Tables, V&P Scientific, Inc., pp. 1-3, 2010.*

* cited by examiner

*Primary Examiner*—Douglas Mc Ginty
(74) *Attorney, Agent, or Firm*—Stein McEwen, LLP

(57) ABSTRACT

An inkjet printable electrode composition, an electrode including the electrode composition, and a secondary battery including the electrode. The inkjet printable electrode composition includes oxide, a conducting agent, a wetting agent, a binder and an aqueous solvent, in which the viscosity of the binder is in a range of 2 to 20 cps in a 1 wt % aqueous solution of the binder. The inkjet printing electrode composition includes a binder having an appropriate viscosity to allow ink to be easily ejected when the ink is inkjet-printed, and thus, a uniform, thin, and planarized pattern may be formed onto a collector by inkjet printing, without clogging of a nozzle, and thus electrode and secondary battery may be formed at low costs.

22 Claims, 2 Drawing Sheets

INKJET PRINTABLE ELECTRODE COMPOSITION, ELECTRODE INCLUDING THE SAME, AND SECONDARY BATTERY INCLUDING THE ELECTRODE

CROSS-REFERENCE TO RELATED APPLICATIONS

This application claims the benefit of Korean Patent Application No. 2007-133606, filed on Dec. 18, 2007, in the Korean Intellectual Property Office, the disclosure of which is incorporated herein by reference.

BACKGROUND OF THE INVENTION

1. Field of the Invention

Aspects of the present invention relate to an inkjet printable electrode composition, an electrode including the same, and a secondary battery including the electrode, and more particularly, to an inkjet printable electrode composition, which is to be used to form a thin electrode, an electrode including the same, and a secondary battery including the electrode.

2. Description of the Related Art

Recently, demands for secondary batteries as a power source for portable electrical devices, such as mobile phones, personal digital assistants (PDAs), or portable multimedia players (PMP); as a power source to drive a motor of high-performance hybrid vehicles or electric vehicles; as a power source for flexible displays, such as e-inks, e-papers, flexible liquid crystal display devices (LCDs), or flexible organic light emitting diode (OLED) displays, are increasing rapidly. In the future, secondary batteries will be used as a power source for integrated circuit devices on a printed circuit board. However, when secondary batteries are used as a power source for portable electrical devices, there are limitations on product designs due to packaging requirements to obtain stability. To be used as a power source to drive a motor, secondary batteries should be prepared to be high performance, small, and lightweight. To be used as a power source for flexible displays, secondary batteries should be prepared to be thin, lightweight, and flexible. To be used as a power source for integrated circuit devices, secondary batteries should be patterned to a predetermined shape.

Such various properties required of the secondary batteries can be obtained using an inkjet printing method instead of a conventional slurry coating method. The inkjet printing method is suitable to provide a thin, uniform, and planarized pattern of an electrode for a secondary battery at low costs.

Such an inkjet printing method allows a user to print a desired pattern having relatively high resolution at low costs. Due to the advantages of inkjet printing, inkjet printing methods have been used in home and office printers. According to the inkjet printing method, ink is ejected in a drop-on-demand manner, i.e., ink is ejected in a predetermined amount at a predetermined location. Therefore, the inkjet printing method is efficient in terms of ink consumption and environmentally friendly, and thus, the inkjet printing method is used in a wide range of industrial applications including forming electrodes for displays or color filters.

An inkjet printer, which is operated using the inkjet printing method, may perform its printing process using a thermal spraying method in which bubbles are formed and ink is ejected by a force generated when bubbles are formed and a piezo method in which intensity of a current is adjusted using a piezo actuator and ink is ejected. In the thermal spraying method and the piezo method, nozzles can be easily clogged by particles of ink when the ink is ejected, because the size of nozzles is as small as 20-50 µm. To stably eject ink, a moisturizer (or a wetting agent), such as glycol or glycerol, is used in a great amount to hinder evaporation of ink at nozzles.

However, when a conventional ink for inkjet printing is used to form a pattern for an electrode, the viscosity of the ink is increased due to the addition of a binder which increases a binding force between a collector and electrode forming components and protects the formed electrode when the electrode swells or shrinks during charging and discharging. Therefore, it is difficult to eject the ink through a nozzle due to such high viscosity of the ink.

SUMMARY OF THE INVENTION

Aspects of the present invention provide an inkjet printable electrode composition, which includes a binder and has an appropriate viscosity for inkjet printing. Aspects of the present invention also provide an electrode prepared by inkjet-printing the electrode composition on a collector. Aspects of the present invention also provide a secondary battery including the electrode.

According to an aspect of the present invention, there is provided an inkjet printable electrode composition, including an oxide, a conducting agent, a wetting agent, a binder, and an aqueous solvent, in which the viscosity of the binder is in a range of 2 to 20 cps in a 1 wt % aqueous solution of the binder.

According to another aspect of the present invention, there is provided an electrode prepared by inkjet-printing the inkjet printable electrode composition on a collector. According to another aspect of the present invention, there is provided a secondary battery including the electrode.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
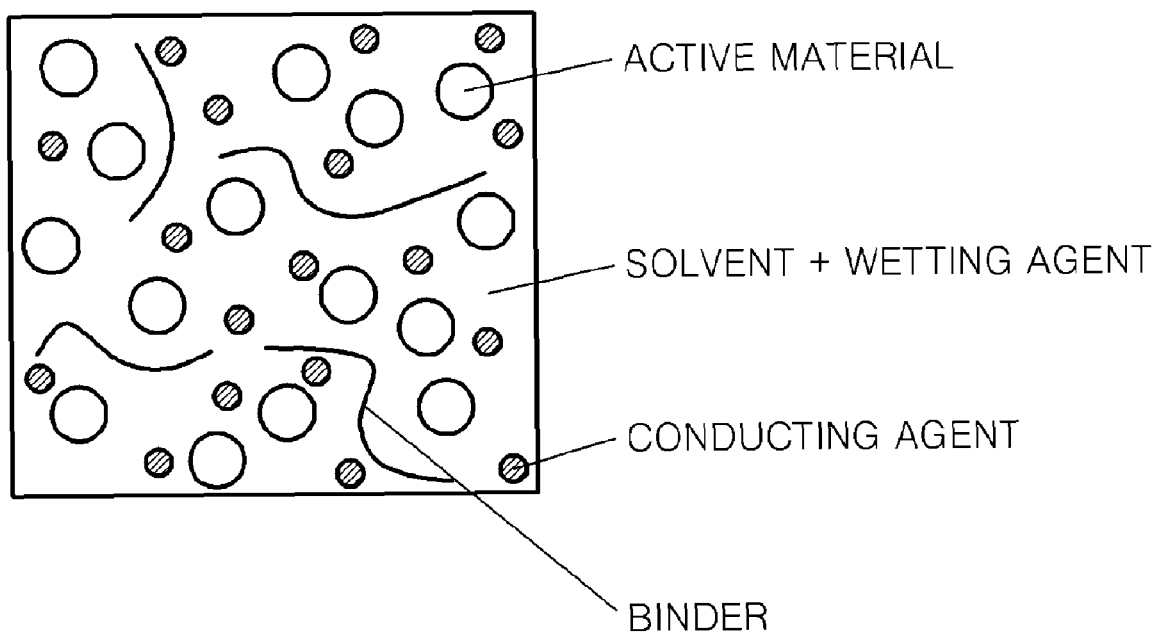
FIG. 1 is a schematic view of an electrode composition according to aspects of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

An inkjet printable electrode composition according to aspects of the present invention includes a binder having an appropriate viscosity such that ink (i.e., inkjet printable electrode composition) can be easily ejected through a nozzle during inkjet printing. Without clogging of a nozzle, the electrode composition can be inkjet-printed in a predetermined, thin, uniform, and planarized pattern on a collector to form an electrode at low costs.

As illustrated in FIG. 1, the inkjet printable electrode composition according to aspects of the present invention includes an active material, a conducting agent, a wetting agent, a binder, and an aqueous solvent. The viscosity of the binder may be 2 to 20 centipoise (cps) in a 1 wt % aqueous solution of the binder. Due to such low viscosity, the clogging of the nozzle can be prevented even when the binder is used and an electrode pattern can be formed.

The binder intensifies a binding force between components of the electrode composition after the inkjet printing, for example, within the active material, between the active material and the conducting agent, and between the active material and the collector. In addition, the binder hinders a change in volume of an electrode when a battery is charged or discharged. The binder may include one or more of a compound selected from the group consisting of polyvinyl alcohol, ethylene-propylene-diene terpolymer, stylene-butadiene rubber, polyvinylidene difluoride (PVDF), polytetrafluoroethylene, tetrafluoroethylene-hexafluoropropylene copolymer, and carboxymethylcellulose. For example, the binder may be carboxymethylcellulose, specifically carboxymethylcellulose having a degree of etherification of 0.8 to 1.0.

The carboxymethylcellulose may be represented by Formula 1 below and is an anionic aqueous cellulose based on a glucose monomer obtained by substituting —OH of a cellulose with a carboxymethyl group. In the molecular formula of the carboxymethylcellulose below, y denotes a degree of etherification, that is, a degree of the carboxymethyl group bound through etherification. The degree of etherification can be a maximum of 3 in theory; but, commercially available binders generally have a degree of etherification in a range of 0.2 to 1.5. When the degree of etherification of carboxymethylcellulose is 0.8 or less, carboxymethylcellulose may not be soluble in water. On the other hand, when the degree of etherification of carboxymethylcellulose is 1.0 or more, the viscosity of carboxymethylcellulose in an aqueous solution may be too high. The carboxymethylcellulose may be represented by Formula 1:

<Formula 1>

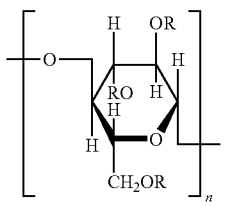

where R is H or $CH_2COONa$. The Formula 1 may be $[C_6H_7O_2(OH)_x(OCH_2COONa)_y]_n$ where n=a degree of polymerization, x=1.50 to 2.80, y=0.2 to 1.50 (a degree of etherification), and x+y=3.0.

Characteristics of carboxymethylcellulose as a binder can be identified using viscosity in a 1 wt % aqueous solution of the binder. The viscosity of carboxymethylcellulose increases as a degree of polymerization increases, that is, when a molecular weight of carboxymethylcellulose increases, its viscosity increases and thus its binding force increases. However, the viscosity of the ink increases as well. According to aspects of the present invention, the viscosity may be 1 to 100 cps, preferably 2 to 20 cps. When the viscosity is greater than 100 cps, a nozzle may be clogged when the ink is inkjet printed.

The active material in the electrode composition may be any oxide that is used in the art. For example, the oxide may be any oxide that is used as an electrode active material of a secondary battery. The amount of the oxide may be in a range of 0.1 to 10 wt %, specifically in a range of 1 to 5 wt %, based on the total amount of the electrode composition. When the amount of the oxide is less than 0.1 wt %, the printing efficiency is low. On the other hand, when the amount of the oxide is greater than 10 wt %, particles of the oxide may cluster and the viscosity of the electrode composition may increase thereby decreasing the stability and ejection properties of the electrode composition.

The active material may be used as a cathode active material or an anode active material. When the active material is used as a cathode active material, the active material may be a Li—Co-based composite oxide, such as $LiCoO_2$; a Li—Ni-based composite oxide, such as $LiNiO_2$; a Li—Mn-based composite oxide, such as $LiMn_2O_4$ or $LiMnO_2$; a Li—Cr-based composite oxide, such as $Li_2Cr_2O_7$ or $Li_2CrO_4$; a Li—Fe-based composite oxide, such as $LiFeO_2$; or a Li—V-based composite oxide. An anode active material may be a Li—Ti-based composite oxide, such as $Li_4Ti_5O_{12}$; a transition metal oxide, such as $SnO_2$, $In_2O_3$, or $Sb_2O_3$; or a carbonaceous material such as graphite, hard carbon, acetylene black, or carbon black.

The conducting agent improves the conductivity of particles of the active material. The conducting agent may be acetylene black, carbon black, graphite, carbon fiber, or carbon nanotube. The amount of the conducting agent may be 1 to 20 wt % based on the weight of the oxide. When the amount of the conducting agent is less than 1 wt % based on the weight of the oxide, conductivity of the active material may be lowered. On the other hand, when the amount of the conducting agent is greater than 20 wt %, activity of an electrode may be decreased.

The aqueous solvent in the electrode composition may be a solvent mixture of water, such as deionized water, and an alcohol, such as ethanol, methanol, butanol, propanol, isopropylalcohol, isobutylalcohol, or N-methyl-2-pyrrolidone. Herein, the alcohol is used to adjust the drying speed. The amount of the aqueous solvent may be 80 to 99 wt % based on the total weight of the electrode composition. When the amount of the aqueous solvent is outside this range, the viscosity of the electrode composition is too high or too low.

The inkjet printable electrode composition according to aspects of the present invention includes a wetting agent. The wetting agent prevents drying of the ink at a nozzle thereby preventing clogging of the nozzle. For example, the wetting agent may be glycol, glycerol, or pyrrolidone. The amount of the wetting agent may be in a range of 5 to 40 wt % based on the total weight of the electrode composition. When the amount of the wetting agent is less than 5 wt %, sufficient wetting effect may not be obtained. On the other hand, when the amount of the wetting agent is greater than 40 wt %, the polarity of the solvent may be decreased resulting in particles of the electrode composition being clustered.

The inkjet printable electrode composition according to aspects of the present invention may further include a dispersing agent to disperse particles of the active material and the conducting agent. The dispersing agent may be any dispersing agent that is available in the art. For example, the dispersing agent may include one or more of a dispersing agent selected from the group consisting of fatty acid salt, alkyldicarboxylic acid salt, alkyl sulfuric esters, multi-valent sulfuric ester alcohol salt, alkylnaphthalene sulphate, alkylbenzene sulphate, alkylnaphthalene sulfuric acid salt, alkylsulfonsuccinate, naphthenate, alkylether carboxylate, acylated peptid, alphaolefin sulfate, N-acylmethyl taurinate, alkylether sulfate, secondary multi-valent alcohol ethoxysulfate, polyoxyethylenealkylpermylethersulfate, monogylsulfate, alkyletherphosphoric ester salt, alkylphosphoric ester salt, alkylamine salt, alkylpyrridium salt, alkylimidazolium salt, fluorine-based or silicon-based acrylic acid polymer, polyoxyethylenealkylether, polyoxyethylenesterolether, lanoline derivatives of polyoxyethylene, polyoxyethylene/polyoxypropylene copolymer, polyoxyethylenesorbitan fatty acid ester, monoglyceride fatty acid ester, sucrose fatty acid ester, alkanolamid fatty acid, polyoxyethylene fatty acid amid, polyoxyethylenealkylamine, polyvinylalcohol, polyvinylpyrridone, polyacrylamid, carboxylic group-containing soluble polyester, hydroxyl group-containing cellulose-based resin, acryl resin, butadiene resin, acrylic acids, styrene acryls, polyesters, polyamids, polyurethanes, alkylbetamine, alkylamineoxide, and phosphatidylcholine. The amount of the dispersing agent may be in a range of 1 to 20 wt % based on the weight of the oxide. When the amount of the dispersing agent is less than 1 wt %, sufficient dispersing effect may not be obtained. On the other hand, when the amount of the dispersing agent is greater than 20 wt %, activity of an electrode may be degraded.

The inkjet printable electrode composition according to aspects of the present invention may further include a buffer to obtain an appropriate pH. The buffer may include one or more buffers selected from the group consisting of amines, such as trimethylamine, triethanolamine, diethanolamine, or ethanolamine; sodium hydroxide; and ammonium hydroxide. The amount of the buffer may be in a range of 0.1 to 5 wt % based on the weight of the oxide. When the amount of the buffer is less than 0.1 wt % based on the weight of the oxide, sufficient buffering effect may not be obtained. On the other hand, when the amount of the buffer is greater than 5 wt % based on the weight of the oxide, the manufacturing costs increased.

The inkjet printable electrode composition is prepared in a form of an ink and the ink is inkjet printed. Specifically, the electrode composition forming components, such as the active material, the conducting agent, the solvent, the wetting agent, the dispersing agent, the buffer, or the binder are mixed in appropriate amounts and then a ball mill and a bead mill are sequentially used to mix the components. The mixture is sequentially filtered through 1 μm and 0.45 μm polytetrafluoroethylene (PTFE) syringe filters to completely prepare the ink.

The obtained ink including the inkjet printable electrode composition is inkjet-printed in a predetermined pattern on a collector.

Embodiments of an electrode will now be described in detail. First, as for a cathode, a collector may be any collector that is used as a cathode of a secondary battery. For example, as for a lithium battery, the collector may be an aluminum collector. The inkjet printable electrode composition according to aspects of the present invention, which may include the cathode active material, the conducting agent, the solvent, the wetting agent, the dispersing agent, the buffer, and the binder, as described above is uniformly dispersed on the collector through inkjet printing, and the printed electrode composition is dried to completely evaporate the solvent used so as to prepare the cathode.

As for an anode, like the cathode, an anode collector may be any collector that is used as an anode of a secondary battery. For example, as for a lithium battery, the anode collector may be a copper collector. The inkjet printable electrode composition according to aspects of the present invention, which may include the anode active material, the conducting agent, the solvent, the wetting agent, the dispersing agent, the buffer, and the binder, as described above is uniformly dispersed to the anode collector through inkjet printing, and the printed electrode composition is dried to completely evaporate the solvent so as to prepare the anode.

An embodiment of a method of preparing a lithium battery that is a secondary battery using the electrode which has been described will now be described in detail. The cathode and the anode which have been prepared as described above are separated by a separator. The separator may be any separator that is used in lithium batteries. Specifically, the separator may have low resistance to flow of electrolyte ions and a high electrolyte-retaining ability. For example, the separator may be selected from the group consisting of glass fiber, polyester, polyethylene, polypropylene, polytetrafluoroethylene (PTFE), and a combination thereof, each of which may have a form of a woven or non-woven fabric. Specifically, a foldable separator formed of polyethylene or polypropylene may be suitable for lithium ion batteries, and a separator having an excellent organic electrolyte-retaining ability may be suitable for lithium ion polymer batteries.

A method of preparing these separators will now be described in detail. A polymer resin, filler, and a solvent are mixed to prepare a separator composition. The separator composition may be directly coated on an electrode and dried to obtain a separator film. Alternatively, the separator composition is cast onto a support and dried to form a separator film, and the formed separator film is removed from the support, dried, and laminated on one of the electrodes.

The polymer resin is not limited, and may be any binder that is used in an electrode. For example, the polymer resin may be vinylidenefluoride/hexafluoropropylene copolymer, polyvinylidenefluoride, polyacrylonitrile, polymethylmethacrylate, and mixtures thereof. In particular, the polymer resin may be vinylidenefluoride/hexafluoropropylene copolymer in which the amount of hexafluoropropylene is in a range of 8 to 25 parts by weight.

The separator is placed between the cathode and the anode to form a battery assembly. The battery assembly is wound or folded so as to be placed in a cylindrical battery case or a rectangular battery case, and then an organic electrolyte is injected thereto, thus completely manufacturing a lithium ion battery.

Meanwhile, a plurality of such battery assemblies may be stacked in a multi-cell structure, and then immersed in an organic electrolyte. The obtained structure may be placed in a pouch and sealed. As a result, a lithium ion polymer battery is completely manufactured.

An organic electrolyte for such lithium batteries may be a lithium salt, and an organic solvent mixture including a solvent that has a large dielectric constant and a solvent having a low boiling point. The solvent that has a large dielectric constant according to aspects of the present invention may be any commercially available solvent that has a large dielectric constant. Such solvent may be a cyclic carbonate, such as ethylene carbonate, propylene carbonate, or butylene carbonate; or a gamma-butyrolactone.

The solvent having a low boiling point may be any solvent that is commercially available in the art. Such solvent may be a chain carbonate, such as dimethyl carbonate, ethylmethyl carbonate, diethyl carbonate, or dipropyl carbonate; dimethoxyethane; diethoxyethane; or a fatty acid ester derivative, but is not limited thereto.

The mixture ratio of the solvent that has a large dielectric constant to the solvent having a low boiling point may be in a range of 1:1 to 1:9. When the mixture ratio is outside that range, sufficient discharge capacity and sufficient charging and discharging lifetime may not be obtained.

The lithium salt may be any lithium salt that is used in lithium batteries in the art. For example the lithium salt may include at least one lithium salt selected from the group consisting of $LiClO_4$, $LiCF_3SO_3$, $LiPF_6$, $LiN(CF_3SO_2)$, $LiBF_4$, $LiC(CF_3SO_2)_3$, and $LiN(C_2F_5SO_2)_2$.

The concentration of the lithium salt in the organic electrolyte may be in a range of 0.5 to 2M. When the concentration of the lithium salt is less than 0.5M, conductivity of the organic electrolyte may be decreased and the performance of the organic electrolyte may be degraded. On the other hand, when the concentration of the lithium salt is greater than 2.0M, the viscosity of the organic electrolyte may be increased and mobility of lithium ions may be decreased.

The electrode composition according to aspects of the present invention is not limited to use in the lithium batteries described above but may be used in applications such as solar cells or fuel cells.

Aspects of the present invention will be described in further detail with reference to the following examples. These examples are for illustrative purposes only and are not intended to limit the scope of the present invention.

Example 1

3 wt % of $Li_4Ti_5O_{12}$ and 0.3 wt % of acetylene black were added to a solvent mixture including 70 wt % of deionized water, 20 wt % of ethanol, 6 wt % of diethyleneglycol, and 0.6 wt % of triethanolamine, and then the obtained mixture was milled using a paint shaker which uses zirconia beads having a particle size of 0.3 mm for 2 hours. The milled product was sequentially filtered using 1 μm and 0.45 μm PTFE syringe filters to prepare an inkjet printable electrode composition.

Examples 2 to 6 and Comparative Example

Electrode compositions were prepared in the same manner as in Example 1, except that electrode composition forming components were used in the amounts as described in Table 1.

Properties of the binders used are shown in Table 2.

TABLE 2

|  | 1205 CMC of Daicel Co | 1210 CMC of Daicel Co | 1380 CMC of Daicel Co |
| --- | --- | --- | --- |
| Viscosity | 2 | 20 | 1000 |
| Degree of etherification | 0.8~1.0 | 0.8~1.0 | 1.0~1.5 |

Experimental Example

The electrode compositions prepared according to Examples 1 to 6 and the Comparative Example were used as inkjet printable electrode compositions and inkjet printed on a copper foil using an HP inkjet printer of the DeskJet 5550 series.

The viscosity and ink ejection performance of the electrode compositions were evaluated. The results are shown in Table 3.

TABLE 3

|  | Inkjet printable electrode composition viscosity | Ink ejection performance |
| --- | --- | --- |
| Example 1 | 3.5 | good |
| Example 2 | 3.1 | good |
| Example 3 | 4.2 | good |
| Example 4 | 4.7 | good |
| Example 5 | 4.1 | good |
| Example 6 | 5.8 | good |
| Comparative Example | 7.9 | bad |

Figure 2:
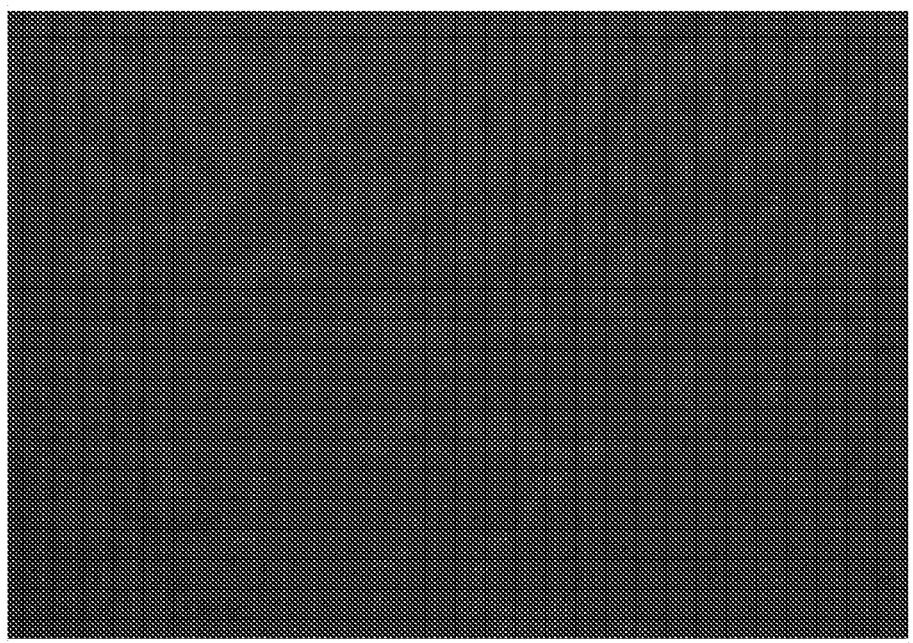
FIG. 2 is an image showing an electrode prepared according to Example 1.
Figure 3:
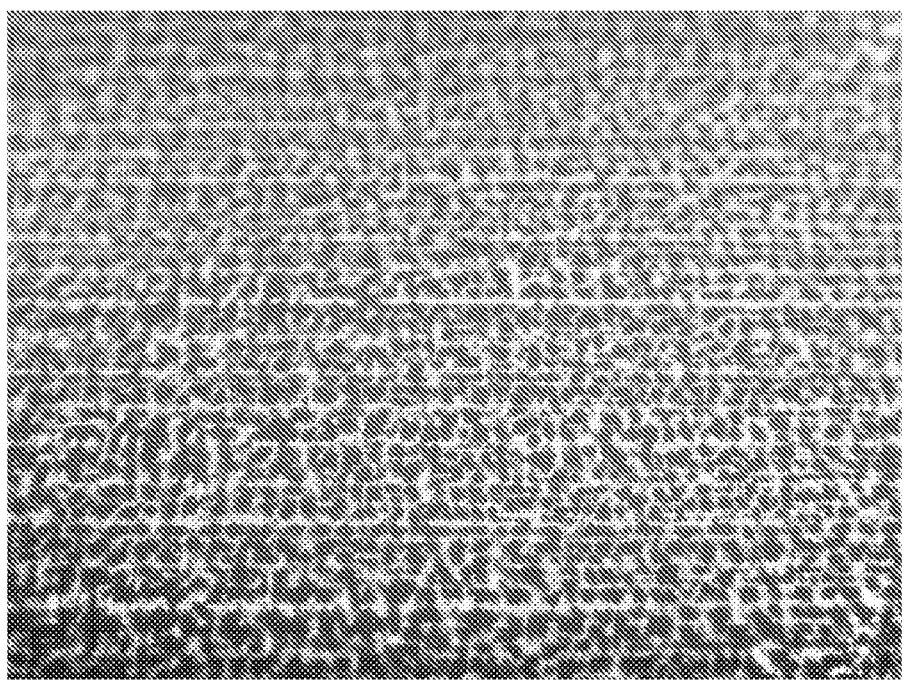
FIG. 3 is an image showing an electrode prepared according to Comparative Example 1.

Referring to Table 3, the electrodes formed from Examples 1 to 6 were clean and thus the electrode compositions prepared according aspects of the present invention in which the binder was 0.01 to 0.5 wt % of 1205 or 1210 carboxymethylcellulose have good ink ejection performances. An electrode formed by inkjet printing the inkjet printable electrode composition according to Example 1 is shown in FIG. 2 and indicates good deposition of the inkjet printable electrode composition on the copper foil; whereas, the electrode composition prepared according to Comparative Example in which the binder was 1380 carboxymethylcellulose demonstrates bad ink ejection performance as shown in FIG. 3.

TABLE 1

|  | Component | Ex. 1 | Ex. 2 | Ex. 3 | Ex. 4 | Ex. 5 | Ex. 6 | Comparative Example |
| --- | --- | --- | --- | --- | --- | --- | --- | --- |
| Solvent | Deionized water | 70 | 70 | 70 | 70 | 70 | 70 | 70 |
|  | ethanol | 20 | 20 | 20 | 20 | 20 | 20 | 20 |
| Wetting agent | Diethyleneglycol | 6 | 6 | 6 | 6 | 6 | 6 | 6 |
| Buffer | Triethanolamine | 0.6 | 0.6 | 0.6 | 0.6 | 0.6 | 0.6 | 0.6 |
| Active material | $Li_4Ti_5O_{12}$ | 3 | 3 | 3 | 3 | 3 | 3 | 3 |
| Conducting agent | Acetylene black | 0.3 | 0.3 | 0.3 | 0.3 | 0.3 | 0.3 | 0.3 |
| Binder | 1205 CMC of Daicel Co | 0.1 | 0.01 | 0.5 | — | — | — | — |
|  | 1210 CMC of Daicel Co | — | — | — | 0.1 | 0.01 | 0.5 | — |
|  | 1380 CMC of Daicel Co | — | — | — | — | — | — | 0.1 |

An inkjet printable electrode composition according to aspects of the present invention includes a binder which has a viscosity of 2 to 20 cps in a 1 wt % aqueous solution of the binder so as to provide a sufficient binding force between electrode forming components and a collector and to allow inkjet printable electrode composition to be easily ejected. Inclusion of such a binder in the electrode composition results in maintaining the viscosity of the electrode composition to 5 cps or lower, and thus excellent ink ejection performance may be obtained. In addition, the amount of an active material may be increased according to a decrease in the viscosity of the electrode composition, and thus high printing efficiency may be obtained.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An electrode composition, comprising:
   an electrode active material;
   a conducting agent;
   a wetting agent;
   a binder comprising carboxymethylcellulose; and
   an aqueous solvent,
   wherein the viscosity of the binder is 1 to 20 cps in a 1 wt % aqueous solution of the binder, and
   wherein the electrode composition is inkjet printable.

2. The electrode composition of claim 1, wherein the viscosity of the binder is 2 to 20 cps in the 1 wt % aqueous solution of the binder.

3. The electrode composition of claim 1, wherein the binder further comprises at least one compound selected from the group consisting of polyvinyl alcohol, ethylene-propylene-diene terpolymer, styrene-butadiene rubber, polyvinylidene difluoride (PVDF), polytetrafluoroethylene, and tetrafluoroethylene-hexafluoropropylene copolymer.

4. The electrode composition of claim 1, wherein the binder is a carboxymethylcellulose having a degree of etherification of 0.8 to 1.0.

5. The electrode composition of claim 1, wherein the electrode active material is an oxide for a secondary battery.

6. The electrode composition of claim 5, wherein the amount of the oxide is 0.1 to 10 wt % based on the total weight of the electrode composition.

7. The electrode composition of claim 1, wherein the conducting agent comprises at least one selected from the group consisting of acetylene black, carbon black, graphite, carbon fiber, and carbon nanotube.

8. The electrode composition of claim 1, wherein the amount of the conducting agent is 1 to 20 wt % based on the weight of the oxide.

9. The electrode composition of claim 1, wherein the amount of the aqueous solvent is 80 to 99 wt % based on the total weight of the electrode composition.

10. The electrode composition of claim 1, wherein the wetting agent is selected from glycols, glycerols, and pyrrolidones.

11. The electrode composition of claim 1, wherein the amount of the wetting agent is 5 to 40 wt % based on the total weight of the electrode composition.

12. The electrode composition of claim 1, further comprising a dispersing agent and/or a buffer.

13. An electrode prepared by inkjet-printing the electrode composition of claim 1 on a collector.

14. A secondary battery comprising the electrode of claim 13.

15. A lithium battery comprising the electrode of claim 13.

16. An electrode composition, comprising:
   an electrode active material;
   a conducting agent to increase the conductivity of particles of the active material;
   a wetting agent to prevent drying of the electrode composition at a nozzle through which the electrode composition is inkjet printed;
   a carboxymethylcellulose binder to increase a binding force within the electrode composition after the electrode composition is inkjet printed and to decrease a volume change of the electrode composition during charging/discharging of a battery in which the electrode composition is inkjet printed on an electrode therein; and
   an aqueous solvent to adjust a drying speed of the electrode composition after the electrode composition is inkjet printed,
   wherein the viscosity of the binder is 1 to 20 cps in a 1 wt % aqueous solution of the binder, and
   wherein the electrode composition is inkjet printable.

17. The electrode composition of claim 16, wherein the carboxymethylcellulose binder comprises a carboxymethylcellulose having a degree of etherification of 0.2 to 1.5.

18. The electrode composition of claim 17, wherein the carboxymethylcellulose binder comprises a carboxymethylcellulose having a degree of etherification of 0.8 to 1.0.

19. The electrode composition of claim 16, wherein the carboxymethylcellulose binder comprises a carboxymethylcellulose represented by Formula 1:

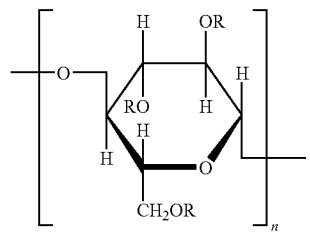

Formula 1 where each R is independently H or $CH_2COONa$.

20. The electrode composition of claim 16, wherein the carboxymethylcellulose is $[C_6H_7O_2(OH)_x(OCH_2COONa)_y]_n$, where n=a degree of polymerization, x=1.50 to 2.80, y=a degree of etherification, and x+y=3.0.

21. The electrode composition of claim 20, wherein the degree of etherification is 0.2 to 1.5.

22. The electrode composition of claim 16, wherein the active material is an anode active material or a cathode active material.

* * * * *